June 24, 1969 G. W. PAPPAS 3,452,223
SHAPING CIRCUIT
Filed Aug. 20, 1965
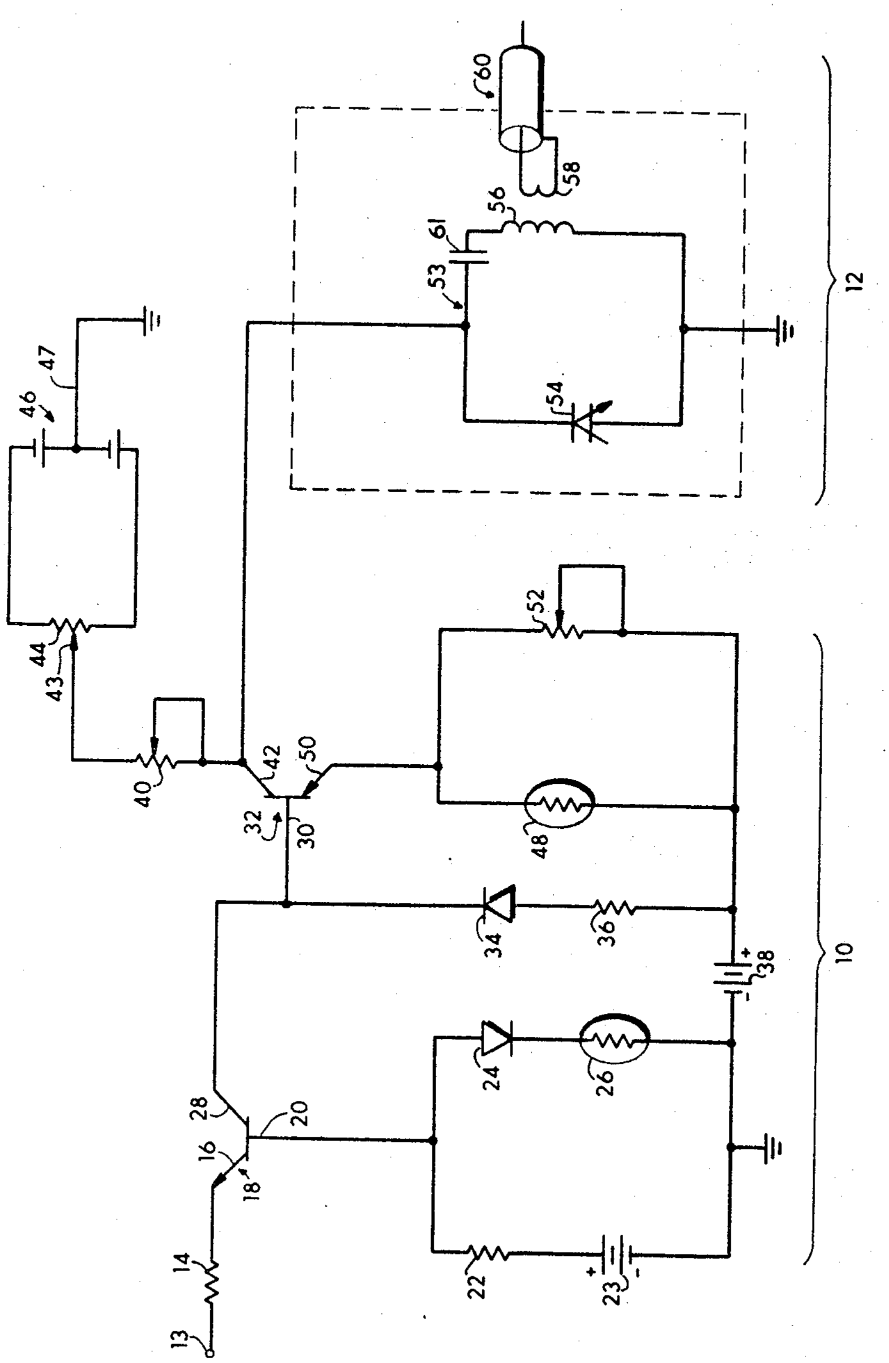
INVENTOR
GEORGE W. PAPPAS
BY
ATTORNEY United States Patent Office 3,452,223
Patented June 24, 1969

3,452,223

SHAPING CIRCUIT

George W. Pappas, Nashua, N.H., assignor to Sanders Associates, Inc., Nashua, N.H., a corporation of Delaware Filed Aug. 20, 1965, Ser. No. 481,376
Int. Cl. H02j *1/00;* H03k *19/00*
U.S. Cl. 307—320 3 Claims This invention relates to an electronic wave-shaping circuit employing a non-linear element to produce an output voltage that is a selected multiple power of an input voltage.

The invention also provides an electronic tuner developing an output frequency that is continuously and linearly related to the amplitude of an input voltage.

Prior wave-shaping circuits producing an output voltage whose amplitude is a multiple power of an input voltage change the output voltage incrementally, i.e. in discrete steps, in response to continuous changes in the amplitude of the input voltage. The circuits generally utilize a switching element such as a diode to produce each step or increment of the output voltage. Hence, the output voltage is a piecewise linear approximation of the desired function of the input voltage. In many electronic devices the differences in amplitude between the desired power of the input voltage and such an approximated output voltage results in undesirable inaccuracies. For example, when the output voltage is used to tune a resonant circuit, a continuous change in the frequency-controlling input voltage produces an incrementally changing output frequency that differs by varying amounts from the desired continuously-changing frequency.

These inaccuracies with the prior art circuits can be reduced by increasing the number of switching elements in the wave-shaping circuit, thereby increasing the number of output voltage steps produced in response to a given change in the amplitude of the input voltage. The output voltage then somewhat more closely approximates the desired power of the input voltage. However, where it is desired that the output voltage be a relatively accurate reproduction of the selected power of the input voltage, the prior art circuits require an excessive number of switching devices, particularly where the input voltage amplitude changes over a wide range.

Accordingly, it is an object of the present invention to provide an improved electronic circuit for producing a voltage whose amplitude is proportional to a selected multiple power of an input voltage.

A more particular object of the invention is to provide an *n*th power wave-shaping circuit that produces an output voltage changing substantially continuously with the input voltage.

A further object of the invention is to provide a relatively simple, accurate electronic circuit producing an output voltage whose amplitude changes continuously according to the fourth power of the amplitude of an input voltage.

Another object of the invention is to provide means for obtaining a linear relationship between a control voltage and the output frequency of a resonant circuit tuned with a voltage-dependent capacitor.

A further object of the invention is to provide an electronic tuner employing a voltage-dependent tuning capacitor and characterized by an accurate continuous change in resonant frequency according to a linear function of an input voltage.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawing, which is a schematic dagram of an electronic tuner embodying the invention.

In general, the tuner has a wave-shaping circuit that adjusts a voltage-tunable capacitor to control the resonant frequency of a tuned circuit. The wave-shaping circuit makes use of the nonlinear relationship of the current and voltage of a varistor, which is a two terminal non-polarized semi-conductor device whose current is proportional to the *n*th power of the voltage between its terminals. The value of *n* depends on the varistor.

The wave-shaping circuit applies a linear function of an input voltage to the varistor and a resistor in series with the varistor then develops a voltage that is continuously proportional to the *n*th power of the input voltage.

Such a wave-shaping circuit arranged to produce an output voltage proportional to the fourth power of the input voltage is well-suited for controlling the resonant frequency of a circuit tuned with a voltage-variable capacitor, i.e. a capacitor such as a varactor whose capacitance changes with applied voltage. The resonant frequency of a tuned circuit is proportional to $[1/(C)^{1/2}]$, where C is the capacitance. The capacitance of one type of voltage-variable capacitor is proportional to $[1/(V)^{1/2}]$, where V is the voltage applied to the capacitor. Thus, the resonant frequency of the tuned circuit is proportional to $[(V)^{1/4}]$, i.e. to the fourth root of V.

When the fourth-power output voltage of the wave-shaping circuit is applied to such a variable capacitor, the resonant frequency of the tuned circuit is proportional to the first power of the voltage input to the wave-shaping circuit. More important, since the wave-shaping circuit output voltage is a continuous function of the input voltage, the tuned circuit resonant frequency changes continuously as well as linearly with the input voltage.

In general terms, then, the tuner has a wave-shaper producing an *n*th power output voltage, and the capacitance of the tuning capacitor is proportional to the $(2/-N)$ power of the control voltage applied to the capacitor.

As will now be described in detail, the illustrated tuner requires relatively few components to provide the above operation. As shown in the drawing, the tuner comprises a wave-shaping circuit indicated generally at 10 and a tuned circuit indicated generally at 12.

In the wave-shaping circuit, an input frequency-controlling voltage at a terminal 13 is applied through a series resistor 14 to the emitter 16 of a common base transistor 18. The transistor base 20 is connected to the interconnection of a resistor 22 and the series combination of a diode 24 and a biasing resistor 26, which is preferably a varistor as discussed below. The other terminal of the resistor 26 is connected to ground, and the other end of the resistor 22 is connected to a positive supply 23 of direct voltage. The resistor 22, diode 24 and varistor 26 thus form a votlage divider that develops the transistor base bias voltage. For use with a silicon transistor 18, the diode 24 is a silicon diode so that the temperature-dependent varations in its forward voltage drop compensate for the temperature-dependent variations in the emitter-base junction characteristics of the transistor.

The collector 28 of the transistor 18 is connected directly to the base 30 of a transistor 32. A silicon diode 34, compensating for temperature-dependent characteristics of the emitter-base junction of silicon transistor 32, is in series with a load resistor 36 between the collector 28 and the positive terminal of a direct-current supply 38.

A variable gain-adjusting load resistor 40 connects the transistor collector 42 to the center tap 43 of an adjustable voltage divider 44 having end terminals connected to opposite and preferably equal direct voltages developed by a supply 46 having a grounded center terminal 47. A wave-shaping varistor 48 is connected between the emitter 50 of the transistor 32 and the positive terminal of supply 38.

As also shown in the drawing, the tuned circuit 12 comprises a resonant circuit 53 formed with a voltage-variable capacitor 54 in parallel with an inductor 56. Capacitor 61 is a DC blocking capacitor whose capacitance is so large that it has negligible effect on the frequency of the tuned circuit. It is needed to prevent the wave-shaped voltage from being short circuited to ground through the inductor 56. The capacitor 54, appropriately a varactor, is connected between the collector 42 and ground so that the wave-shaper output voltage is applied across the capacitor.

A winding 58 is magnetically coupled with the inductor 56 and is connected to a shielded terminal 60 for coupling external circuits to the resonant circuit 53. While a tuned circuit utilizing magnetic coupling to a utilization means is shown and discussed, other coupling means may be employed.

Consider the operation of the tuner with a varistor 48 whose resistance is inversely proportional to the fourth power of the voltage across it, and with a variable capacitor 54 whose capacitance is inversely proportional to the second root of the voltage across it. The transistor 18 amplifies the input voltage at terminal 13 so that the voltage at the base 30 of the transistor 32 is considerably larger than the base-emitter drop in the transistor 32. The gain of the transistor 18 is substantially constant over the range of input voltages. The voltage across the varistor 48 then is essentially directly proportional to the input voltage. In the transistor 32, the collector current is a substantially constant portion of the emitter current over the region of interest. Hence the varistor current, and correspondingly the voltage across the load resistor 40, which is the wave-shaper output voltage, is proportional to the fourth power of the input voltage.

In the tuned circuit 12, the capacitance of the capacitor 54 is inversely proportional to the square root of the wave-shaper output voltage. This produces a change in resonant frequency proportional to the fourth root of the output voltage. However, the wave-shaper output voltage is proportional to the fourth power of the input voltage. Hence, the tuned circuit resonant frequency is directly proportional to the wave-shaper input voltage.

The biasing varistor 26 connected with the base of transistor 18 compensates for temperature-dependent variations in the resistance of the wave-shaping varistor 48. For this purpose, the varistor 26 is selected to have the same temperature characteristics as the varistor 48, i.e. they are preferably of the same type. When the temperature of varistor 48 increases, its resistance decreases. As a result, for a given voltage at the transistor base 30, the current through the varistor 48 will increase. However, the higher temperature also decreases the resistance of varistor 26, thereby causing the bias voltage at the transistor base 20 to decrease toward ground. This decreases the gain of the transistor 18, so that for a given input voltage it applies a smaller voltage to the base 30 of transistor 32 than at lower temperatures, thereby largely cancelling the change in emitter current in transistor 32 due to temperature-dependent changes in varistor 48.

With further reference to the wave-shaper 10, changing the value of the load resistor 40 changes the gain of the transistor 32. Hence, this resistor provides a control for the range of output voltages produced at the transistor collector 42 for a given range of input voltages at the wave-shaper input terminal 13. Movement of the tap 43 on the voltage divider 44 adjusts the value of the output voltage when the transistor is not conducting, i.e. in the absence of an input voltage at the terminal 13.

Where desired, a resistor 52 can be connected in parallel with the varistor 48 to adjust the shape of the output voltage. The resistor 52, conveniently a variable resistor as shown, has a minimum resistance considerably larger than the resistance of the varistor 48 over the operating range of voltages impressed across the varistor. Thus, the net resistance of the varistor 48 and resistor 52, between the emitter 50 and the supply 38, is still essentially that of the varistor, which decreases from an initial value according to the fourth power of the voltage across it. Hence, the transistor emitter current is primarily proportional to the fourth power of the varistor voltage.

Thus, the invention provides an electronic tuner developing a resonant frequency that is continuously and linearly related to the input voltage over a relatively wide range of input voltage amplitudes and throughout a considerable range of ambient temperatures.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

I claim:

1. In an electronic circuit developing an output voltage whose amplitude is proportional to the $n$th power of an applied voltage where $n$ is greater than three, the combination comprising:
   - (A) input terminal means for receiving said applied voltage,
   - (B) a transistor having
     - (1) a base in circuit with said input terminal means,
     - (2) an emitter, and
     - (3) a collector,
   - (C) means forming a common return conductor,
   - (D) direct-current supply means having one terminal connected to said common return conductor,
   - (E) a circuit element
     - (1) having a pair of leads,
     - (2) whose current is proportional to the $(n)$th power of the voltage between said leads, and
     - (3) in series at said leads between said emitter and the other terminal of said supply means,
   - (F) a load resistor in series between said collector and said return conductor,
   - (G) a second resistor in parallel with said circuit element, and
   - (H) adjustable bias including a potentiometer connected across the terminals of a source of unidirectional voltage, means in series between said collector and said conductor and maintaining said collector at a selected voltage with respect to said return conductor when said transistor is not conducting.

2. An electronic wave-shaping circuit for developing a voltage the amplitude of which is proportional to the $n$th power of an input voltage, where $n$ is greater than three, comprising,
   - a first transistor including a base, a collector and an emitter,
   - a source of unidirectional voltage including first and second terminals,
   - a first non-polarized two terminal varistor the resistance of which is inversely proportional to the $n$th power of the voltage appearing thereacross,
   - said first varistor being connected between said emitter and said first terminal of said source, a load resistor, across which said output voltage is developed, connected between said collector and said second terminal of said source, a second transistor, including a base, a collector and an emitter, connected in an amplifier circuit, means for applying said input voltage to the base-emitter circuit of said second transistor, means for applying the output of said amplifier circuit to the base-emitter circuit of said first transistor, and a second varistor, similar to said first varistor, connected in the base circuit of said second transistor to vary the potential of said base as the temperature of said second varistor varies, whereby changes in ambient temperature tending to vary the current through said first varistor and said load resistor are substantially compensated for by variations in the current through said second varistor which varies the bias on said base of said second transistor and the gain thereof.

3. A circuit according to claim 2 further comprising:

(A) a capacitor connected to receive between its terminals at least a portion of the voltage developed across said load resistor, the capacitance of said capacitor being proportional to the square root of the voltage between its terminals, and (B) means forming with said capacitor a tuned circuit whose resonant frequency is proportional to the square root of the capacitance of said capacitor.

References Cited

UNITED STATES PATENTS

| | | | |
|---|---|---|---|
| 1,023,917 | 1912 | Bennett | 338—20 |
| 1,850,587 | 1932 | Joffe | 338—20 |
| 2,747,158 | 1956 | Le Bel | 338—20 |
| 3,117,293 | 1/1964 | Mortley | 334—15 |
| 3,192,491 | 6/1965 | Hesselberth | 334—15 |
| 3,204,207 | 8/1965 | Denker | 307—88.5 |
| 3,227,967 | 1/1966 | Ebisch | 307—88.5 |
| 3,333,215 | 7/1967 | Israel | 334—15 |

OTHER REFERENCES

"Voltage Variable Capacitors—State of the Art," Electronic Industries, pp. 90–93, December 1959, copy in 307/88.5 (CD).

McGraw-Hill Encyclopedia of Science and Technology, vol. 14, published 1966, page 281.

JOHN S. HEYMAN, *Primary Examiner.*

H. A. DIXON, *Assistant Examiner.*

U.S. Cl. X.R.

307—271, 310; 334—15